United States Patent
Park et al.

(10) Patent No.: US 7,282,801 B2
(45) Date of Patent: Oct. 16, 2007

(54) MICROELECTRONIC DEVICE CHIP INCLUDING HYBRID AU BUMP, PACKAGE OF THE SAME, LCD APPARATUS INCLUDING MICROELECTRONIC DEVICE CHIP AND METHOD OF FABRICATING MICROELECTRONIC DEVICE CHIP

(75) Inventors: Hyung-keun Park, Yongin-si (KR); Woo-jin Jang, Seoul (KR); Young-ho Kim, Suwon-si (KR); Tae-sung Moon, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/226,797

(22) Filed: Sep. 14, 2005

(65) Prior Publication Data

US 2006/0055037 A1  Mar. 16, 2006

(30) Foreign Application Priority Data

Sep. 15, 2004  (KR)  .................. 10-2004-0073801

(51) Int. Cl.
*H01L 23/48* (2006.01)
(52) U.S. Cl. .................. 257/737; 257/738; 257/778
(58) Field of Classification Search ............... 257/737, 257/738, 778
See application file for complete search history.

(56) References Cited

U.S. PATENT DOCUMENTS

| | | | |
|---|---|---|---|
| 4,855,251 A | 8/1989 | Iyogi et al. | ............ 437/183 |
| 5,171,711 A | 12/1992 | Tobimatsu | ............ 437/182 |
| 5,208,186 A | 5/1993 | Mathew | ............ 437/183 |
| 6,153,940 A * | 11/2000 | Zakel et al. | ............ 257/779 |
| 6,596,621 B1* | 7/2003 | Copeland et al. | ............ 438/614 |
| 2003/0155943 A1 | 8/2003 | Morishita | ............ 324/770 |
| 2003/0209803 A1 | 11/2003 | Suzuki et al. | ............ 257/723 |

FOREIGN PATENT DOCUMENTS

| | | |
|---|---|---|
| EP | 0 895 633 B1 | 5/2002 |
| JP | 6-232136 | 8/1994 |
| JP | 2000-21916 | 1/2000 |
| JP | 2002-261111 | 9/2002 |
| KR | 2002-0018591 | 3/2002 |

\* cited by examiner

*Primary Examiner*—Roy Karl Potter
(74) *Attorney, Agent, or Firm*—Mills & Onello LLP

(57) ABSTRACT

A microelectronic device chip including a hybrid Au bump in which foreign materials are not generated in a probe tip in an electrical die sorting (EDS) test is provided. The microelectronic device chip includes a chip pad which is connected to a microelectronic device formed on a substrate and on which the microelectronic device is brought into electrical contact with the outside of the chip. Further, the microelectronic device chip includes a bump which is formed on the chip pad and made up of a composite layer including two or more layers.

16 Claims, 11 Drawing Sheets

— single cyan Au bump (before thermal process)
— single cyan Au bump (after thermal process)
— single non-cyan Au bump (before thermal process)
— single non-cyan Au bump (after thermal process)
— hybrid Au bump (before thermal process)
— hybrid Au bump (after thermal process)

| section | initial probe tip | probe tip after performing EDS test 500 times |
|---|---|---|
| single cyan Au bump |  |  |
| single non-cyan Au bump |  |  |
| hybrid Au bump |  |  |

MICROELECTRONIC DEVICE CHIP INCLUDING HYBRID AU BUMP, PACKAGE OF THE SAME, LCD APPARATUS INCLUDING MICROELECTRONIC DEVICE CHIP AND METHOD OF FABRICATING MICROELECTRONIC DEVICE CHIP

This application claims priority from Korean Patent Application No. 10-2004-0073801 filed on Sep. 15, 2004 in the Korean Intellectual Property Office, the contents of which are incorporated herein by reference in their entirety.

BACKGROUND OF THE INVENTION

1. Field of the Invention

The present invention relates to a microelectronic device chip including a hybrid Au bump, a package of the microelectronic device chip, a liquid crystal display (LCD) apparatus including the microelectronic device chip, and a method of fabricating the microelectronic device chip.

2. Description of the Related Art

With the rapid development of technology and the move towards portability, electronic devices such as cellular phones, personal data assistants (PDAs), flat display devices such as LCD devices, and notebook computers have been developed to be thin, light, and small. As a result, chips mounted in these electronic devices have been developed to be miniature. A conductive bump has been widely used as a means to connect chip packages to external electronic devices.

Recently, this conductive bump has been mainly formed using an electrolytic plating method involving a non-cyan series plating solution. A cyan series plating solution was used formerly; however, recently a non-cyan series plating solution has been mainly used. In the case where the conductive bump is formed using a non-cyan series plating solution including $Na_3Au(SO_3)_2$ compared with the use of a cyan series plating solution including $KAu(CN)_2$, a surface of the completed bump is not coarse but has a fine texture making it easy to perform a subsequent combining process. Further, since a noxious gas like HCN is not generated, environmental pollution can be reduced and a safer working environment can be achieved.

An electrical test, referred to as an electrical die sorting (EDS) test, is conducted on the microelectronic device formed on a wafer to check the quality of the chip. The EDS test is conducted by bringing a probe tip into contact with the conductive bump, which is electrically connected to the microelectronic device, and then transmitting an electrical signal to the microelectronic device through the probe tip.

In a case where the conductive bump is formed using the non-cyan series plating solution, foreign materials generated from the conductive bump adhere to the probe tip, thereby frequently generating errors in the electrical signal of the EDS test. The erroneous test results, in which normal chips were found to be short or open, is due to these foreign materials. Further, the foreign materials change the contact resistance between the probe tip and the conductive bump, thereby producing an erroneous test result.

To solve the above problems, whenever chip testing is performed, it is necessary to clean the probe tip. That is, after 20-50 chips are tested, the probe tip cleaning process must be performed. This results in abrasion of the probe tip which increases production costs. Further, EDS test time increases, thereby generating a drop in yield.

SUMMARY OF THE INVENTION

To solve the above problems, it is a feature of the present invention to provide a microelectronic device chip including a hybrid Au bump which does not generate foreign materials in a probe tip in an electrical die sorting (EDS) test.

It is another feature of the present invention to provide a package including the microelectronic device chip.

It is still another feature of the present invention to provide a liquid crystal display (LCD) apparatus including the microelectronic device chip.

It is a further feature of the present invention to provide a method of fabricating the microelectronic device chip.

The above stated features as well as other features and advantages of the present invention will become clear to those skilled in the art upon review of the following description.

According to a first aspect, the invention is directed to a microelectronic device chip comprising a chip pad which is connected to a microelectronic device formed on a substrate to bring the microelectronic device into electrical contact with the outside of the chip and a bump which is formed on the chip pad and which comprises a composite layer including two or more layers.

In one embodiment, the bump is a hybrid Au bump in which a cyan Au plating layer and a non-cyan Au plating layer are stacked. In one embodiment, the hybrid Au bump has a thickness in the range of 1-20 µm. In one embodiment, thicknesses of the cyan Au plating layer and the non-cyan Au plating layer are not less than 0.5 µm. In one embodiment, the cyan Au plating layer of the hybrid Au bump is located on the chip pad and the non-cyan Au plating layer of the hybrid Au bump is located on the cyan Au plating layer. In one embodiment, the non-cyan Au plating layer of the hybrid Au bump is located on the chip pad and the cyan Au plating layer of the hybrid Au bump is located on the non-cyan Au plating layer.

According to another aspect, the invention is directed to a microelectronic device chip comprising a chip pad which is connected to a microelectronic device formed on a substrate to bring the microelectronic device into electrical contact with the outside of the chip. A passivation layer protects the microelectronic device and exposes the chip pad. A bump is formed on the chip pad exposed by the passivation layer and comprises a composite layer including two or more layers. A bump lower conductive layer is formed between the chip pad and the bump to prevent mutual diffusion between the chip pad and the bump, and improve adhesion between the chip pad and the bump.

In one embodiment, the bump is a hybrid Au bump in which a cyan Au plating layer and a non-cyan Au plating layer are stacked. In one embodiment, the hybrid Au bump has a thickness in the range of 1-20 µm. In one embodiment, thicknesses of the cyan Au plating layer and the non-cyan Au plating layer are not less than 0.5 µm. In one embodiment, the cyan Au plating layer of the hybrid Au bump is located on the chip pad and the non-cyan Au plating layer of the hybrid Au bump is located on the cyan Au plating layer. In one embodiment, the cyan Au plating layer of the hybrid Au bump is located on the chip pad and the cyan Au plating layer of the hybrid Au bump is located on the non-cyan Au plating layer.

In one embodiment, the bump lower conductive layer is formed of at least one of TiW, Cr, Cu, Ti, Ni, NiV, Pd, Cr/Cu, TiW/Cu, TiW/Au and NiV/Cu. In one embodiment, the bump lower conductive layer has a stacked structure comprising 0.005-0.5 µm thick TiW and 0.005-0.5 µm thick Au.

In one embodiment, the hybrid Au bump has a structure in which one or more cyan Au plating layers and one or more non-cyan Au plating layers are stacked alternately.

According to another aspect, the invention is directed to a package comprising a microelectronic device chip according to any of those listed above and a tape wiring board which includes wirings made up of external connection terminals and internal connection terminals electrically connected to a bump of the microelectronic device chip.

According to another aspect, the invention is directed to a liquid crystal display apparatus comprising a microelectronic device chip according to any of those listed above and a liquid crystal display panel assembly in which wirings for connecting to the microelectronic device chip are formed; wherein a bump of the microelectronic device chip is electrically connected to the wirings.

In one embodiment, the microelectronic device chip is connected to the liquid crystal display panel assembly using one of a chip-on-glass (COG) method, a tape carrier package (TCP) method and a chip-on-film (COF) method.

According to another aspect, the invention is directed to a method of fabricating a microelectronic device chip comprising: preparing a chip pad which is connected to a microelectronic device formed on a substrate to bring the microelectronic device into electrical contact with the outside of the chip; and forming a bump which is formed on the chip pad and which comprises a composite layer including two or more layers.

In one embodiment, the forming of the bump comprises forming a hybrid Au bump in which a cyan Au plating layer and a non-cyan Au plating layer are stacked on the chip pad. In one embodiment, the bump is formed using an electrolytic plating method. In one embodiment, the cyan Au plating layer is formed using a $KAu(CN)_2$ series plating solution and the non-cyan Au plating layer is formed using a $Na_3Au(SO_3)_2$ series plating solution. In one embodiment, the hybrid Au bump has a thickness in the range of 1-20 μm. In one embodiment, thicknesses of the cyan Au plating layer and the non-cyan Au plating layer are not less than 0.5 μm.

In one embodiment, the forming of the bump comprises forming the cyan Au plating layer on the chip pad and then forming the non-cyan Au plating layer thereon.

In one embodiment, the forming of the bump comprises forming the non-cyan Au plating layer on the chip pad and then forming the cyan Au plating layer thereon.

In one embodiment, the method further comprises performing a thermal process after the formation of the bump. In one embodiment, the thermal process is performed in one of an oxygen and nitrogen atmosphere at a temperature in the range of 250-360° C.

According to another aspect, the invention is directed to a method of fabricating a microelectronic device chip comprising: forming a passivation layer which exposes a chip pad; forming a bump lower conductive layer on the resultant structure; forming a nonconductive-layer pattern defining a region, where a bump is to be formed, on the bump lower conductive layer; forming the bump, which is made up of a composite layer including two or more layers, on the bump lower conductive layer using the nonconductive-layer pattern as a mask; and removing the nonconductive-layer pattern.

In one embodiment, the forming of the bump comprises forming a hybrid Au bump in which a cyan Au plating layer and a non-cyan Au plating layer are stacked. In one embodiment, the forming of the bump is performed using an electrolytic plating method. In one embodiment, the cyan Au plating layer is formed using a $KAu(CN)_2$ series plating solution and the non-cyan Au plating layer is formed using a $Na_3Au(SO_3)_2$ series plating solution. In one embodiment, the hybrid Au bump has a thickness in the range of 1-20 μm. In one embodiment, thicknesses of the cyan Au plating layer and the non-cyan Au plating layer are not less than 0.5 μm. In one embodiment, the forming of the bump comprises forming the cyan Au plating layer on the chip pad and then forming the non-cyan Au plating layer thereon. In one embodiment, the forming of the bump comprises forming the non-cyan Au plating layer on the chip pad and then forming the cyan Au plating layer thereon.

In one embodiment, the forming of the bump lower conductive layer comprises forming the bump lower conductive layer using one of TiW, Cr, Cu, Ti, Ni, NiV, Pd, Cr/Cu, TiW/Cu, TiW/Au and NiV/Cu. In one embodiment, the forming of the bump lower conductive layer comprises forming the bump lower conductive layer having a TiW/Au structure by sequentially sputtering TiW and Au. In one embodiment, the bump lower conductive layer is formed to have a TiW/Au structure in which 0.005-0.5 μm thick TiW and 0.005-0.5 μm thick Au are stacked.

In one embodiment, the method further comprises removing the bump lower conductive layer using the hybrid Au bump as a mask after removing the nonconductive-layer pattern. In one embodiment, the method further comprises performing a thermal process after removing the bump lower conductive layer. In one embodiment, the thermal process is performed in one of an oxygen and nitrogen atmosphere at a temperature in the range of 250-360° C.

In one embodiment, the nonconductive-layer pattern is a photoresist pattern.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

The present invention will now be described more fully with reference to the accompanying drawings, in which preferred embodiments of the invention are shown.

A description will now be given with reference to a liquid crystal display drive integrated circuit (LDI) chip as a microelectronic device chip (hereinafter, simply referred to as a chip), in which characteristics of bumps are described by way of example.

A method of fabricating an LDI chip including a hybrid Au bump structure according to one embodiment of the present invention is described with reference to FIGS. 1 through 8. FIGS. 1 through 8 are cross-sectional views showing a method of fabricating an LDI chip according to one embodiment of the present invention.

Figure 1:
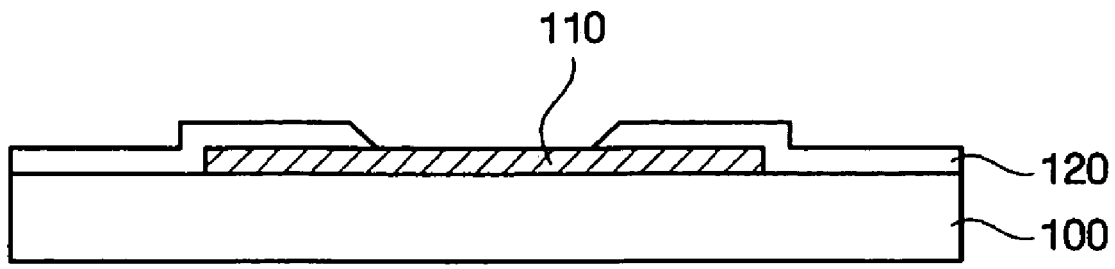
FIGS. 1 through 8 are cross-sectional views showing a method of fabricating a liquid crystal display driver integrated circuit (LDI) chip according to one embodiment of the present invention.

Referring to FIG. 1, a substrate 100 is prepared at the wafer level. Microelectronic devices (not shown) and chip pads 110, which are connected to the microelectronic devices and comprised of uppermost-layer interconnects, are formed on the substrate 100. The electrical contact between the microelectronic devices and the outside of the chip is achieved by the chip pads 110. The chip pads 110 can be formed of a conductive material such as a metal. Preferably, the chip pads 110 are formed of aluminum or copper.

A passivation layer 120, which protects the microelectronic device and exposes the chip pads 110, is formed on the substrate 100. To achieve the electrical contact in the chip pads 110, it is preferable that the passivation layer 120 have a predetermined opening on an upper part of the chip pad 110. The opening of the passivation layer 120 can be formed by a photolithographic etching process using a mask.

Figure 2:
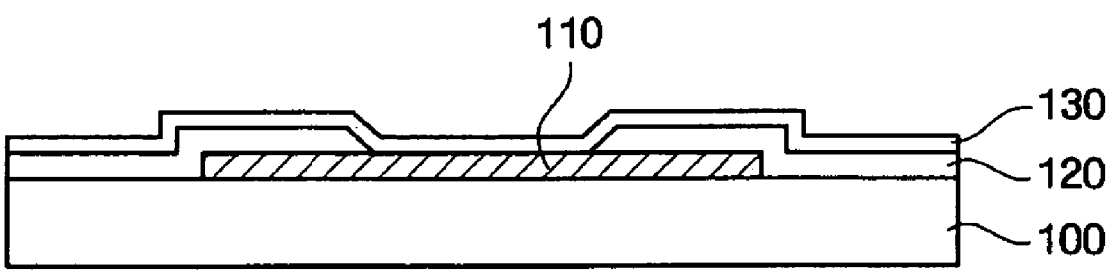

Next, as shown in FIG. 2, a bump lower conductive layer 130 is formed on the substrate 100 on which the passivation layer 120 is formed. It is difficult to directly form a bump (e.g., a hybrid Au bump) on the aluminum or copper chip pad 110, and thus, the bump lower conductive layer 130 is formed. Further, the bump lower conductive layer 130 can play a part in preventing mutual diffusion between the chip pads 110 and upper interconnects. Thus, it is preferable that the bump lower conductive layer 130 have good adhesion with the chip pad 110 and the passivation layer 120 to minimize the stress applied to the substrate 100, and to function as a diffusion barrier layer. Further, low electrical resistance between the bump lower conductive layer 130 and the chip pad 110 is preferable. Therefore, the bump lower conductive layer 130 is formed by evaporation, sputtering, electrolytic plating or electroless plating using TiW, Cr, Cu, Ti, Ni, NiV, Pd; Cr/Cu, TiW/Cu, TiW/Au or NiV/Cu. In one embodiment of the present invention, TiW and Au are sequentially deposited by the sputtering method then a TiW/Au structure bump lower conductive layer 130 is formed. However, the present invention is not limited thereto. The bump lower conductive layer 130 can be made of various materials through various fabrication processes. A TiW layer can function as a diffusion barrier layer between the chip pads 110 and the upper interconnects. Further, an Au layer increases adhesion between the chip pad 110 and the bump and can function as a seed layer in the subsequent electrolytic plating process for forming the upper interconnects.

In one embodiment of the present invention, the bump lower conductive layer 130 can be formed to a thickness of 0.01-1 μm. If the bump lower conductive layer 130 is too thin, functions of the bump lower conductive layer 130 cannot be performed well. Further, if the bump lower conductive layer 130 is too thick, electrical resistance increases. For example, the TiW layer having a thickness of 0.005-0.5 μm or the Au layer having a thickness of 0.005-0.5 μm can be formed as the bump lower conductive layer 130.

Figure 3:
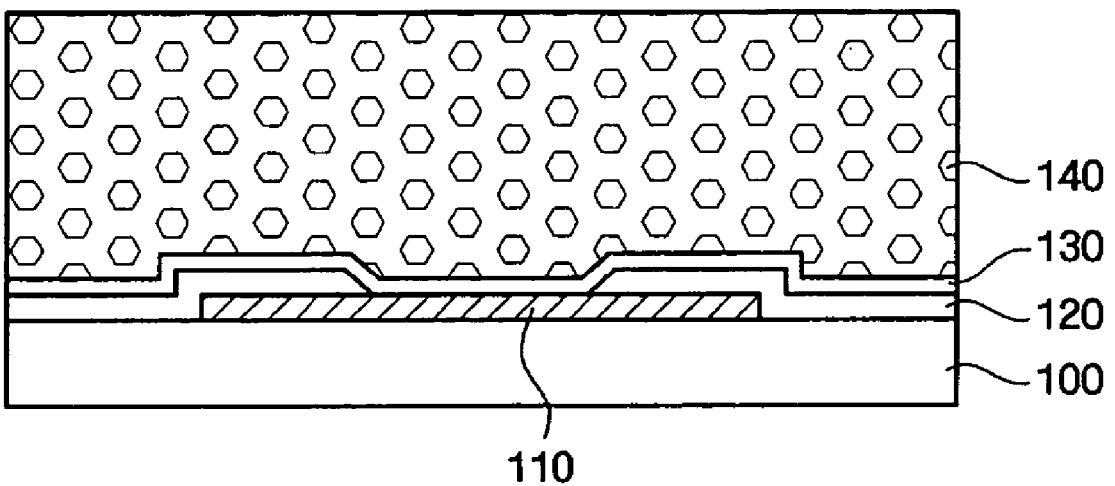

Next, as shown in FIG. 3, a nonconductive layer 140 is formed on the bump lower conductive layer 130. Any insulating material having the following function can be used as the nonconductive layer 140. That is, the insulating material prevents from being plated on the remaining region of the bump lower conductive layer 130 except a partial region of the bump lower conductive layer 130 where the hybrid Au bump is to be formed by blocking current from flowing to the bump lower conductive layer 130 in the subsequent electrolytic plating process (refer to FIGS. 5 and 6) for forming the hybrid Au bump. It is preferable that photoresist be used as the nonconductive layer 140 in consideration of adhesion between the nonconductive layer 140 and the bump lower conductive layer 130 and convenience of patterning of the nonconductive layer 140. The nonconductive layer 140 can be formed using electroless plating, sputtering, evaporation, spin-coating, roll-coating, slit- or slot-die, or the like. In one embodiment of the present invention where photoresist is used as the nonconductive layer 140, the nonconductive layer 140 is formed using spin-coating, roll-coating, or slit- or slot-die. Positive or negative photoresist can be used as the nonconductive layer 140. The deposited thickness of the photoresist can be changed according to a characteristic of the photoresist. After depositing the photoresist, the photoresist is cured in a hot plate by a soft baking process to remove a solvent. An exposure process is selectively performed on the cured photoresist using an exposure source and a mask on which a pattern is formed. Then, the photoresist is thermally cured in the hot plate by a hard baking process to distinguish a region where light is irradiated and a region where light is not irradiated.

Figure 4:
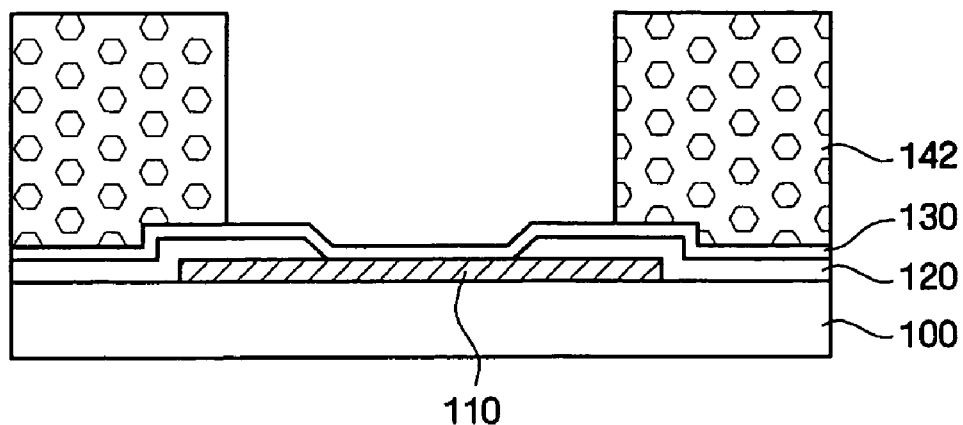

Referring to FIG. 4, after forming the nonconductive layer 140 on the bump lower conductive layer 130, the nonconductive layer 140 is patterned by a photolithographic etching process. As a result, a nonconductive-layer pattern 142 defining a region where the hybrid Au bump (refer to reference numeral 170 of FIG. 6) is formed. As shown in FIG. 4, it is preferable that the hybrid Au bump region be above the chip pad 110.

After forming the nonconductive-layer pattern 142, an ashing process is performed using an $O_2$ plasma to remove organic material, that is, the photoresist remaining on the bump lower conductive layer 130. The bump lower conductive layer 130 develops a hydrophile property through this $O_2$ ashing process.

Figure 5:
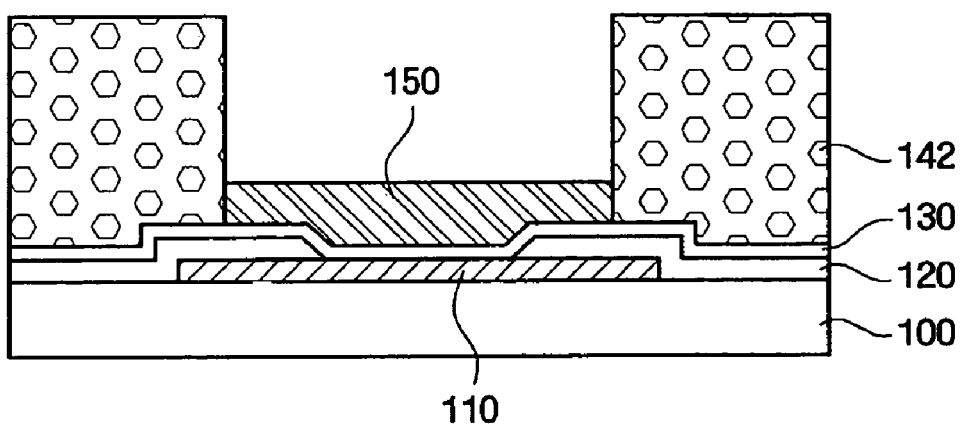
Figure 6:
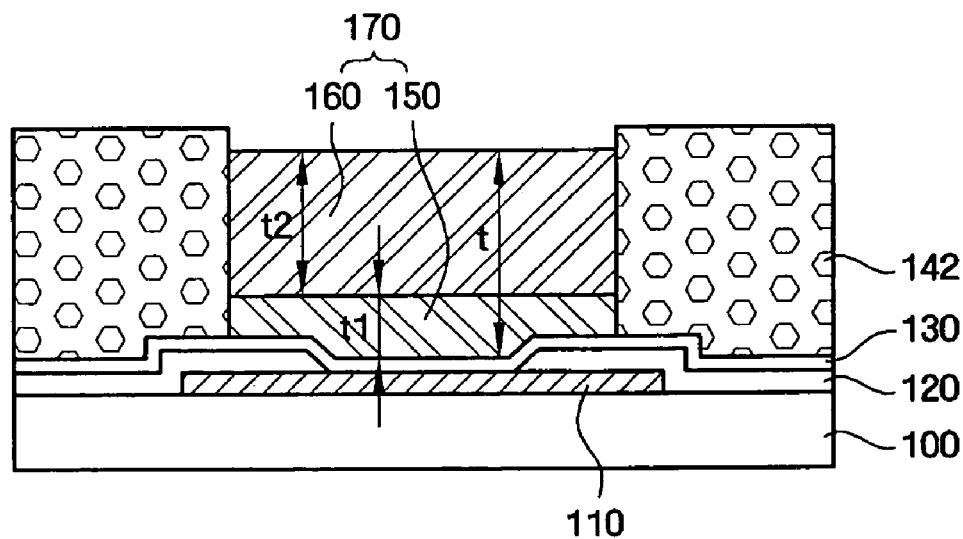

Referring to FIGS. 5 and 6, a hybrid Au bump 170 is formed on the bump lower conductive layer 130 region exposed by the nonconductive-layer pattern 142. First, as shown in FIG. 5, a cyan Au plating layer 150 is formed by an electrolytic plating method on the bump lower conductive layer 130 region exposed by the nonconductive-layer pattern 142. Here, a cyan series plating solution including KAu(CN)$_2$ can be used for forming the cyan Au plating layer 150. Then, the substrate 100 is cleaned using a cleaning solution. Subsequently, as shown in FIG. 6, a non-cyan Au plating layer 160 is formed on the cyan Au plating layer 150 by the electrolytic plating method. Here, a non-cyan series plating solution including Na$_3$Au(SO$_3$)$_2$ can be used as a plating solution for forming the non-cyan Au plating layer 160.

The hybrid Au bump 170 according to one embodiment of the present invention has a structure in which the cyan Au plating layer 150 and the non-cyan Au plating layer 160 are stacked. In a case where an Au bump is fabricated using only a cyan Au plating layer according to the prior art, a surface of the completed Au bump is bumpy and has a coarse texture making it hard to perform a subsequent combining process, and producing environmental pollution problems. Further, in a case where an Au bump is fabricated using only a non-cyan Au plating layer according to the prior art, foreign materials are generated from the Au bump that pollute a probe tip used in a subsequent electrical die sorting (EDS) test. However, the hybrid Au bump 170 according to the present invention has a smooth surface and does not pollute the probe tip in the EDS test. Moreover, environmental pollution can be reduced compared with the case of using only the cyan Au plating layer. Further, although the hybrid Au bump 170 is formed by alternately plating the cyan Au plating layer 150 and the non-cyan Au plating layer 160, plating layer characteristics 150 and 160 are not degraded. That is, even if a plating process is performed by alternately using a cyan series plating solution and a non-cyan series plating solution, both solutions are not absorbed by the nonconductive-layer pattern 142 and the plating solutions are not affected by each other. Further, the nonconductive-layer pattern 142 is not significantly damaged in the above processes. Operations and effects of the present invention will be described in detail below.

Referring to FIG. 6, it is preferable that the hybrid Au bump 170 according to one embodiment of the present invention be formed to a thickness t of 1-20 μm. It is preferable that the whole thickness of the hybrid Au bump 170 and the bump lower conductive layer 130 be as thin as possible within this range, and the hybrid Au bump 170 and the bump lower conductive layer 130 be in electrical communication with the outside of the chip. As a result, the fabrication time and production cost can be minimized. As described above, it is preferable that the bump lower conductive layer 130 be formed to a thickness of 0.01-1 μm and the hybrid Au bump 170 be formed to a thickness of 1-20 μm. In the LDI chip case, a combination of the TiW/Au bump lower conductive layer 130 and the hybrid Au bump 170 formed of Au or Au alloy can be applied readily.

The hybrid Au bump 170 forms a new crystal structure due to a thermal process applied to the cyan Au plating layer 150 and the non-cyan Au plating layer 160. To this end, the cyan Au plating layer 150 and the non-cyan Au plating layer 160 each have the lowest thickness required in the new crystal structure. That is, a thickness t1 of the cyan Au plating layer 150 and a thickness t2 of the non-cyan Au plating layer 160 may be 0.5 μm or more in the present invention. Moreover, the thicknesses t1 and t2 can be 1 μm or more.

Figure 7:
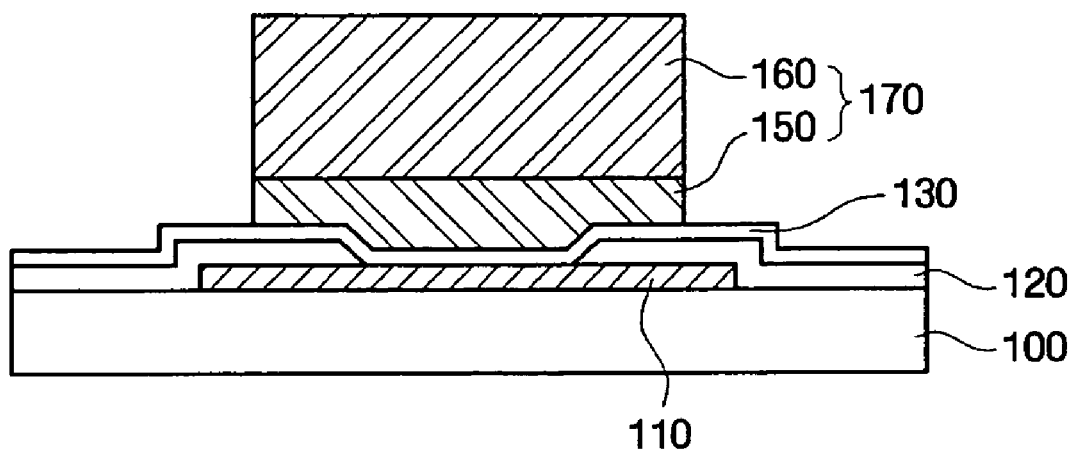

Next, as shown in FIG. 7, the nonconductive-layer pattern 142 is removed by ashing and stripping processes.

Figure 8:
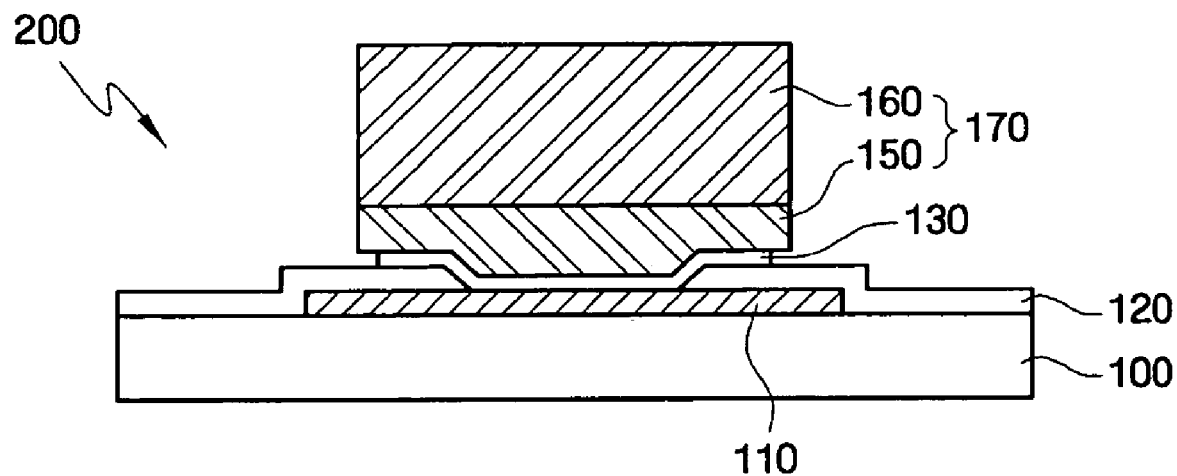

As shown in FIG. 8, the bump lower conductive layer 130 is etched according to a shape of the hybrid Au bump 170, thereby completing an LDI chip 200. The bump lower conductive layer 130 can be etched using a wet etching process in one embodiment of the present invention. For example, in a case of the bump lower conductive layer 130 having a TiW/Au structure, Au can be etched at a temperature of about 23° C. using an etchant containing HCl, HNO$_3$, deionized water in a ratio of 1:3:5, and TiW can be etched at a temperature of about 70° C. using a thick hydrogen peroxide solution. Then, a thermal process is performed on the LDI chip 200 in an atmosphere of oxygen, nitrogen or hydrogen at a temperature of 250-360° C. It is preferable that the thermal process of the LDI chip 200 be performed in an atmosphere of nitrogen at a temperature of about 280° C.

Thereafter, the substrate 100 is diced so that the LDI chip 200 is separated into several individual LDI chips. The obtained individual LDI chips are mounted using various kinds of mounting methods such as chip-on-glass (COG), chip-on-film (COF), or tape carrier package (TCP).

Figure 9A:
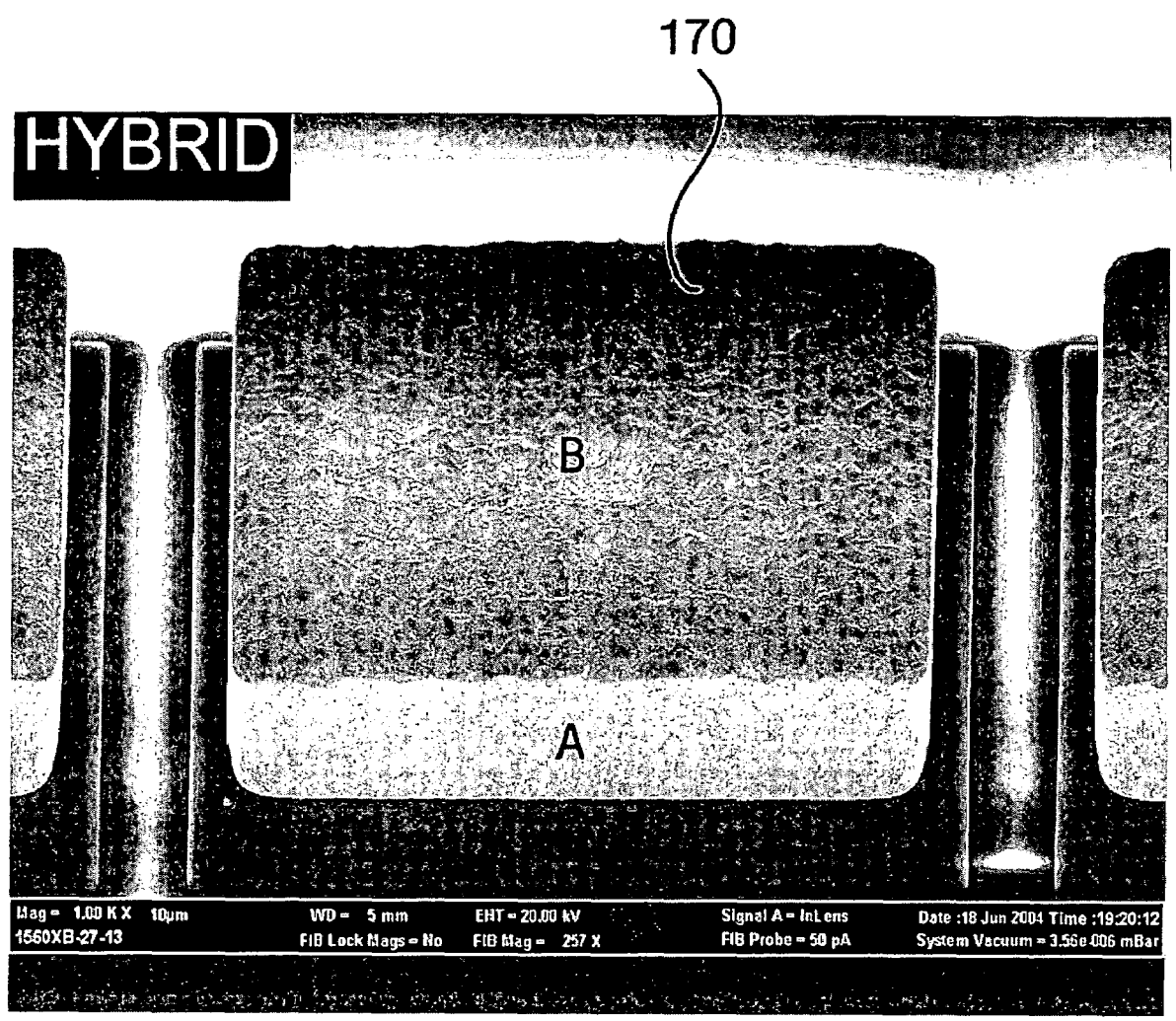
FIGS. 9A through 9C are scanning electron microscope (SEM) images of a hybrid Au bump formed on the LDI chip according to one embodiment of the present invention.
Figure 9B:
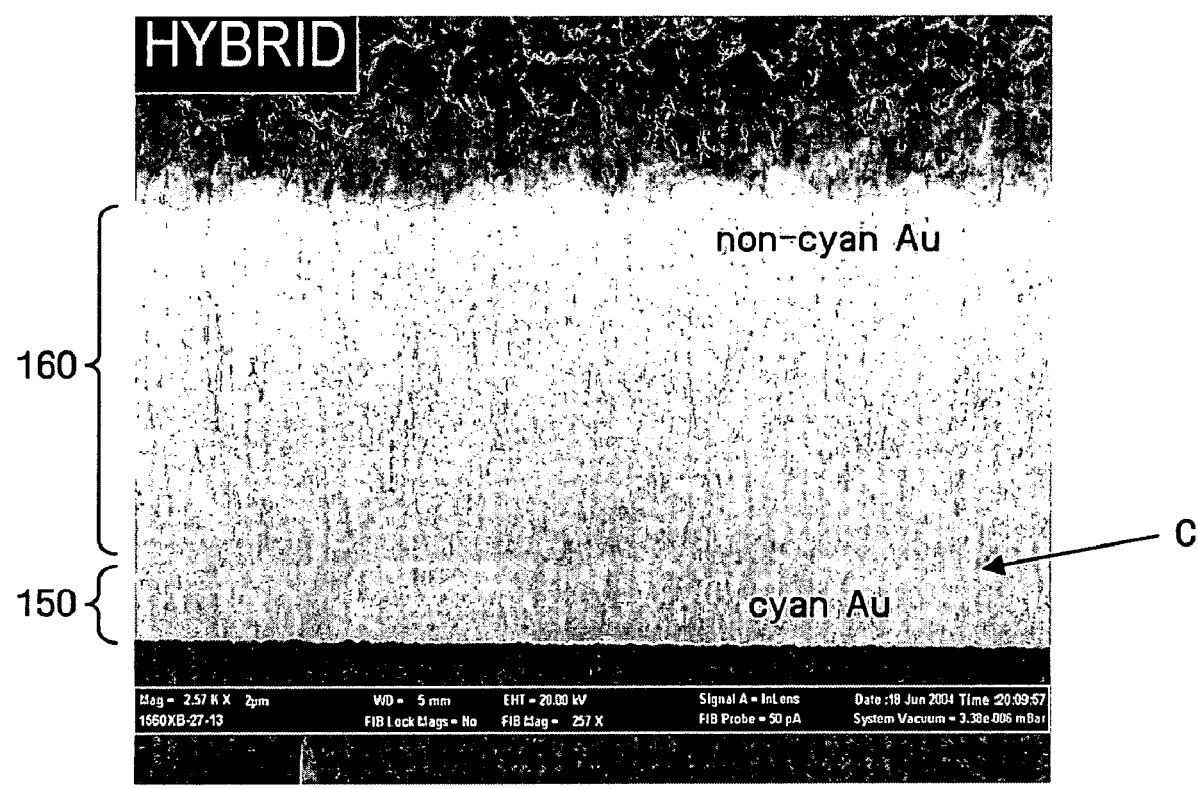
Figure 9C:
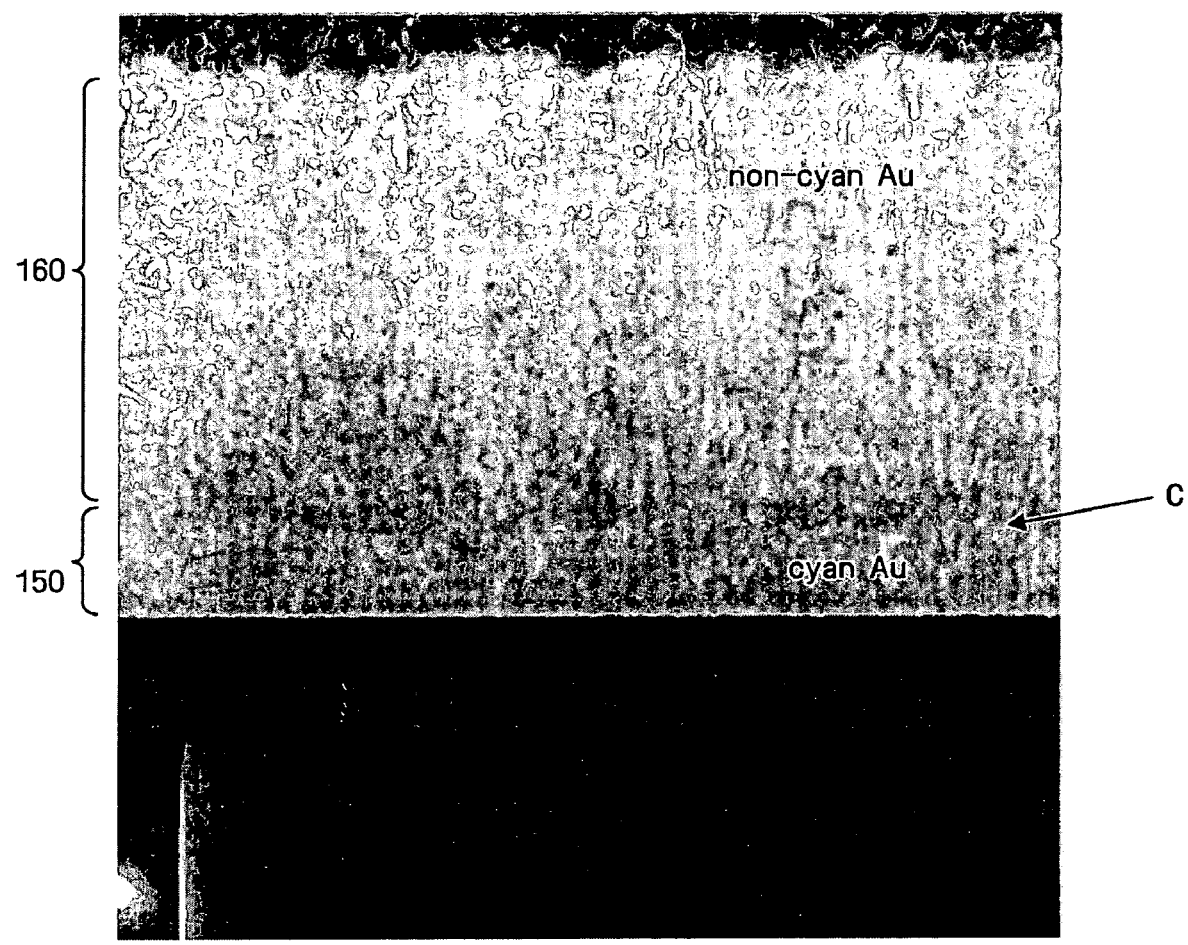

FIGS. 9A through 9C are scanning electron microscope (SEM) images of the hybrid Au bump 170 formed on the LDI chip according to one embodiment of the present invention. FIG. 9A is an SEM image of the rectangular parallelepiped shaped hybrid Au bump 170 taken in a diagonal direction. Portion B indicates an upper surface of the hybrid Au bump 170, and portion A indicates a sidewall of the hybrid Au bump 170. FIG. 9B is an SEM image enlarging the sidewall portion A of the hybrid Au bump 170 of FIG. 9A. As shown in FIG. 9B, a boundary C between the cyan Au plating layer 150 and the non-cyan Au plating layer 160 is visible. FIG. 9C is an SEM image further enlarging the sidewall portion A of the hybrid Au bump 170 of FIG. 9B. The boundary C between the cyan Au plating layer 150 and the non-cyan Au plating layer 160 is clearly visible.

Figure 10:
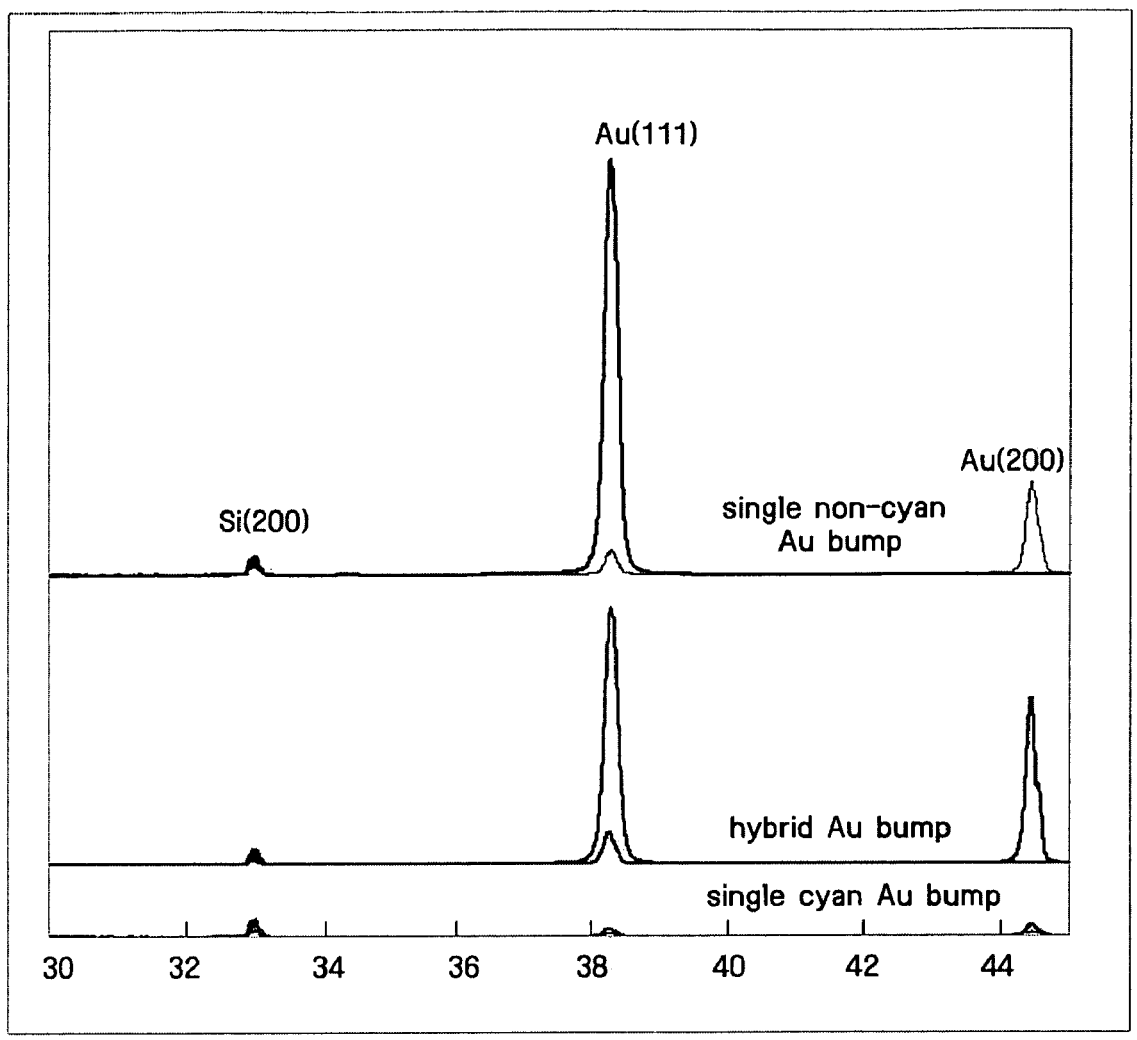
FIG. 10 is a graph showing a peak of X-ray diffraction (XRD) of the hybrid Au bump according to one embodiment of the present invention.

FIG. 10 is a graph showing a peak of X-ray diffraction (XRD) of the hybrid Au bump according to one embodiment of the present invention. The hybrid Au bump used in the present embodiment has a stacked structure of a 3 μm thick cyan Au plating layer and a 14 μm thick non-cyan Au plating layer. FIG. 10 shows XRD peaks of a hybrid Au bump according to one embodiment of the present invention, an Au bump formed of only a cyan Au plating layer (hereinafter, referred to as a single cyan Au bump), and an Au bump formed of only a non-cyan Au plating layer (hereinafter, referred to as a single non-cyan Au bump) before and after performing thermal processes.

Hereinafter, crystal structures of the hybrid Au bump, the single cyan Au bump, and the single non-cyan Au bump are described with reference to FIG. 10.

In the single cyan Au bump, the XRD peaks with respect to a <111> Au crystalline plane and a <200> Au crystalline plane are shown before and after performing a thermal process. The XRD peaks are negligible. That is, the cyan Au bump has a poor crystal structure before and after performing the thermal process (refer to the single cyan Au XRD peaks shown in FIG. 10.). In the single non-cyan Au bump, a <111> Au crystalline plane dominantly appears before performing a thermal process, but disappears after performing the thermal process and a <200> Au crystalline plane appears (refer to single non-cyan Au XRD peaks shown in FIG. 10.). In the hybrid Au bump according to one embodiment of the present invention, an XRD peak of the <111> Au crystalline plane in the non-cyan Au plating layer appears before performing a thermal process, but it is lower than that of the single non-cyan Au bump (Refer to hybrid Au XRD peaks shown in FIG. 10.). Accordingly, while the <111> Au crystalline plane of the hybrid Au bump dominantly appears before performing the thermal process, it is not as prevalent as the same plane of the single non-cyan Au bump. Further, a <200> Au crystalline plane appears after performing the thermal process. Here, the crystallinity of <200> Au crystalline plane of the hybrid Au bump is greater than that of the single non-cyan Au bump.

As such, it is clear from the XRD peak of the hybrid Au bump that the crystal structure of the non-cyan Au plating layer 160 making up the hybrid Au bump 170 differs from that of the single non-cyan Au bump; this is because the hybrid Au bump 170 is formed by stacking the cyan Au plating layer 150 and the non-cyan Au plating layer 160. Further, it is obvious that the crystal structure of the non-cyan Au plating layer 160 making up the hybrid Au bump 170 differs from that of the single non-cyan Au bump after performing the thermal process on the hybrid Au bump 170. As described above, the hybrid Au bump according to one embodiment of the present invention has a structure in which the crystal structures of the cyan Au plating layer 150 and the non-cyan Au plating layer 160 are affected by each other through the thermal process. Accordingly, the hybrid Au bump 170 plays a part in preventing a probe tip from being polluted in the subsequent EDS test process.

Figure 11:
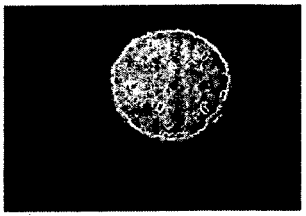
FIG. 11 is a SEM image of a surface of a probe tip showing a degree of pollution of the probe tip after conducting an electrical die sorting (EDS) test.
Figure 11:
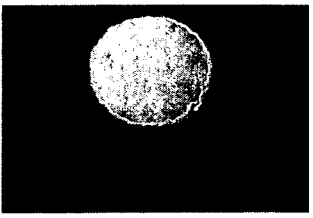
Figure 11:
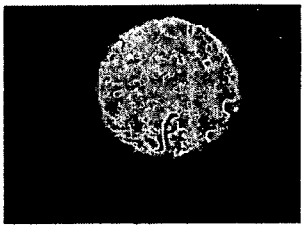
Figure 11:
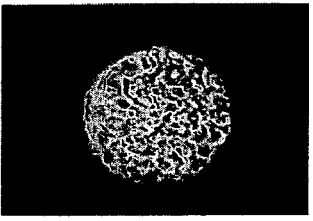
Figure 11:
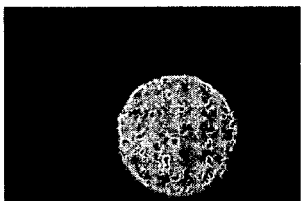
Figure 11:
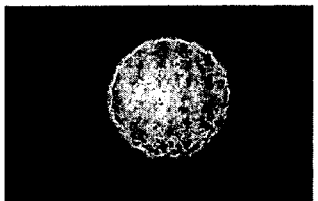

FIG. 11 is a SEM image of a surface of a probe tip showing a degree of pollution of the probe tip after conducting the EDS test. The hybrid Au bump used in one embodiment of the present invention has the structure in which the cyan Au plating layer and the non-cyan Au plating layer are stacked. FIG. 11 is a SEM image of the surface of the probe tip after conducting the EDS test 500 times on the hybrid Au bump according to one embodiment of the present invention, the single cyan Au bump and the single non-cyan Au bump. Referring to FIG. 11, in the single cyan Au bump according to the prior art, after conducting the EDS test the probe tip suffers little degradation, but there are other problems such as the above-described environmental pollution and a more dangerous working environment. The single non-cyan Au bump according to the prior art does not have these problems, after conducting the EDS test the probe tip is seriously degraded. However, the hybrid Au bump according to one embodiment of the present invention, produces little degradation in the probe tip even after conducting the EDS test 500 or more times, and the environmental pollution and dangerous working environment problems are not an issue.

Figure 12:
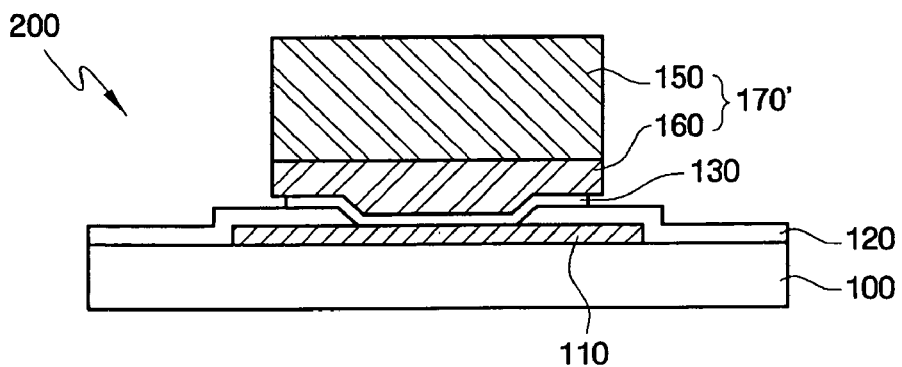
FIG. 12 is a cross-sectional view showing a method of fabricating an LDI chip according to another embodiment of the present invention.

Although the hybrid Au bump 170 having the stacking structure, in which the cyan Au plating layer 150 is formed and then the non-cyan Au plating layer 160 is formed thereon, is used in fabricating the LDI chip according to one embodiment of the present invention, it is a matter of course that as shown in FIG. 12, a hybrid Au bump 170' having a stacking structure, in which a non-cyan Au plating layer 160 is formed firstly and then a cyan Au plating layer 150 is formed thereon, can be used in fabricating an LDI chip 200 according to another embodiment of the present invention, as needed. That is, the hybrid Au bumps 170 and 170' used in the present invention are not limited by the stacking order of the plating layers 150 and 160, because physical properties of the hybrid Au bumps 170 and 170' are determined merely by the combination of the cyan Au plating layer 150 and the non-cyan Au plating layer 160 each having new crystallinity due to the thermal process. Further, the present invention is not limited to the hybrid Au bump having the structure, in which one cyan Au plating layer and one non-cyan Au plating layer are stacked. It is a matter of course that the hybrid Au bump having the structure, in which one or more cyan Au plating layers and one or more non-cyan Au plating layers are alternately stacked, can be applied to the present invention.

Table 1 shows the result of the EDS test of the hybrid Au bump having various structures in the embodiments of the present invention. Table 1 shows the number of open-failed dies caused by degradation of the probe tip after conducting the EDS test on 685 dies. Hereinafter, the EDS test results of the hybrid Au bump are explained with reference to Table 1.

TABLE 1

| EDS Test Conditions and Results | | | |
| --- | --- | --- | --- |
| | Structure | Thermal Process Conditions | Number of open-failed dies (Bin 20) |
| Experimental Example 1 | C(13)/N(2) | $N_2$, 280° C. | 0 |
| Experimental Example 2 | C(13)/N(2) | $O_2$, 355° C. | 0 |
| Experimental Example 3 | C(2)/N(13) | $O_2$, 355° C. | 0 |
| Experimental Example 4 | C(2)/N(13) | $N_2$, 280° C. | 0 |
| Experimental Example 5 | N(2)/C(13) | $O_2$, 355° C. | 0 |
| Experimental Example 6 | N(2)/C(13) | $N_2$, 280° C. | 0 |
| Experimental Example 7 | N(13)/C(2) | $N_2$, 280° C. | 0 |
| Experimental Example 8 | N(13)/C(2) | $O_2$, 355° C. | 0 |
| Comparative Example 1 | C(0.35)/N(14) | $N_2$, 280° C. | 57 |

Here, C indicates a cyan Au plating layer and N indicates a non-cyan Au plating layer and the values in parentheses indicate the thickness of the plating layer.

A hybrid Au bump of the experimental example 1 has a structure in which a 13 μm cyan Au plating layer and a 2 μm non-cyan Au plating layer are sequentially stacked on a bump lower conductive layer and the thermal process is performed in an atmosphere of nitrogen at a temperature of 280° C. A hybrid Au bump of the experimental example 2 has a structure in which a 13 μm cyan Au plating layer and a 2 μm non-cyan Au plating layer are sequentially stacked and the thermal process is performed in an atmosphere of oxygen at a temperature of 355° C. A hybrid Au bump of the experimental example 3 has a structure in which a cyan Au plating layer (2 μm) and a non-cyan Au plating layer (13 μm) are sequentially stacked and the thermal process is performed in an atmosphere of oxygen at a temperature of 355° C. A hybrid Au bump of the experimental example 4 has a structure in which a 2 μm cyan Au plating layer and a 13 μm non-cyan Au plating layer are sequentially stacked and the thermal process is performed in an atmosphere of nitrogen at a temperature of 280° C. A hybrid Au bump of the experimental example 5 has a structure in which a 2 μm non-cyan Au plating layer and a 13 μm cyan Au plating layer are sequentially stacked and the thermal process is performed in an atmosphere of oxygen at a temperature of 355° C. A hybrid Au bump of the experimental example 6 has a structure in which a 2 μm non-cyan Au plating layer and a 13 μm cyan Au plating layer are sequentially stacked and the thermal process is performed in an atmosphere of nitrogen at a temperature of 280° C. A hybrid Au bump of the experimental example 7 has a structure in which a 13 μm non-cyan Au plating layer and a 2 μm cyan Au plating layer are sequentially stacked and the thermal process is performed in an atmosphere of nitrogen at a temperature of 280° C. A hybrid Au bump of the experimental example 8 has a structure in which a 13 μm non-cyan Au plating layer and a 2 μm cyan Au plating layer are sequentially stacked and the thermal process is performed in an atmosphere of oxygen at a temperature of 355° C. A hybrid Au bump of the comparative example 1 has a structure in which a 0.35 μm cyan Au plating layer and a 14 μm non-cyan Au plating layer are sequentially stacked and the thermal process is performed in an atmosphere of nitrogen at a temperature of 280° C.

Referring to Table 1, although the EDS test is conducted on 685 dies of the hybrid Au bump of the present invention according to the experimental examples 1 through 8 without a probe tip clearing process, no open-failed dies were found. However, the many open-failed dies were found in the comparative example 1 having a 0.35 μm cyan Au plating layer. As stated previously, the hybrid Au bump of the present invention is independent of the stacking order of the cyan Au plating layer and the non-cyan Au plating layer making up the hybrid Au bump. Further, when the thicknesses of the cyan Au plating layer and the non-cyan Au plating layer making up the hybrid Au bump are 0.5 μm or more, and more preferably 1 μm or more, probe tip is minimized. This means that the cyan Au plating layer and the non-cyan Au plating layer each must have a very low thickness in order to combine them to make the new crystal structure thereof.

Although description was given of an example of the LDI chip in the above embodiments, it is a matter of course that the structure of the hybrid Au bump according to the embodiments of the present invention can be applied to various microelectronic device chips. For example, the structure of the bump according to the present invention can be usefully applied to chips of a highly integrated semiconductor memory device such as DRAM, SRAM, flash memory, FRAM, MRAM, a micro-electro-mechanical system (MEMS) chip, a chip of a processor such as a CPU, or a DSP. Further, it is a matter of course that the structure of the bump according to the present invention can be applied to a chip comprised of a single element, a chip including the same kind of elements, and a system-on-chip (SOC) including different kinds of elements and required to provide a complete function or a complete system.

The LDI chip according to the various embodiments of the present invention described in FIGS. 1 through 12 can be mounted on various structures according to various mounting methods. For example, the LDI chip can be directly mounted on a display panel by a chip-on-glass (COG) method. It can also be mounted on a package substrate such as a molded lead frame, a printed circuit board (PCB), a flexible tape wiring board, or direct bond copper (DBC). Further, an interposer which provides electrical connection and/or mechanical flexibility between a semiconductor chip and an assembly substrate can be used as the package substrate. The interposer can be made of an elastic material like a tape, polyimide, or a plastic material, and can include a single patterned redistribution layer or a large number of patterned redistribution layers, and a passive element. After the LDI chip according to the embodiments of the present invention is mounted on a flexible tape wiring board by a tape carrier package (TCP) method or a chip-on-film (COF) package method, the LDI chip can be finally mounted on a PCB or a display panel.

Figure 13A:
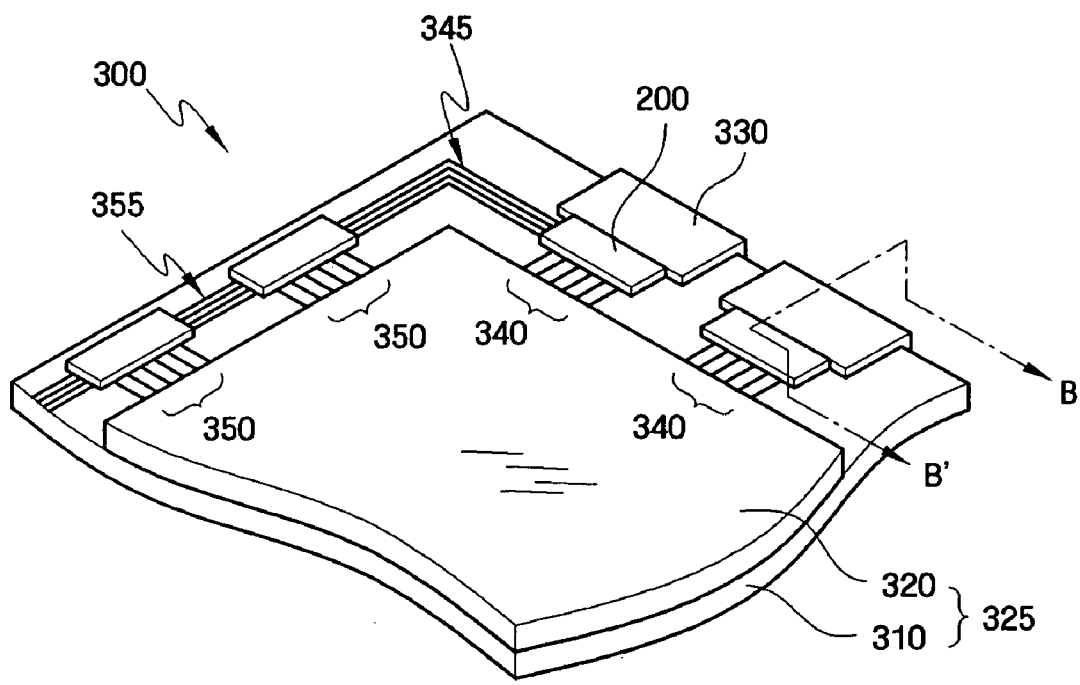
FIG. 13A is a plain view of an LCD (liquid crystal display) panel assembly on which the LDI chip according to one embodiment of the present invention is mounted using a chip-on-glass (COG) method.
Figure 13B:
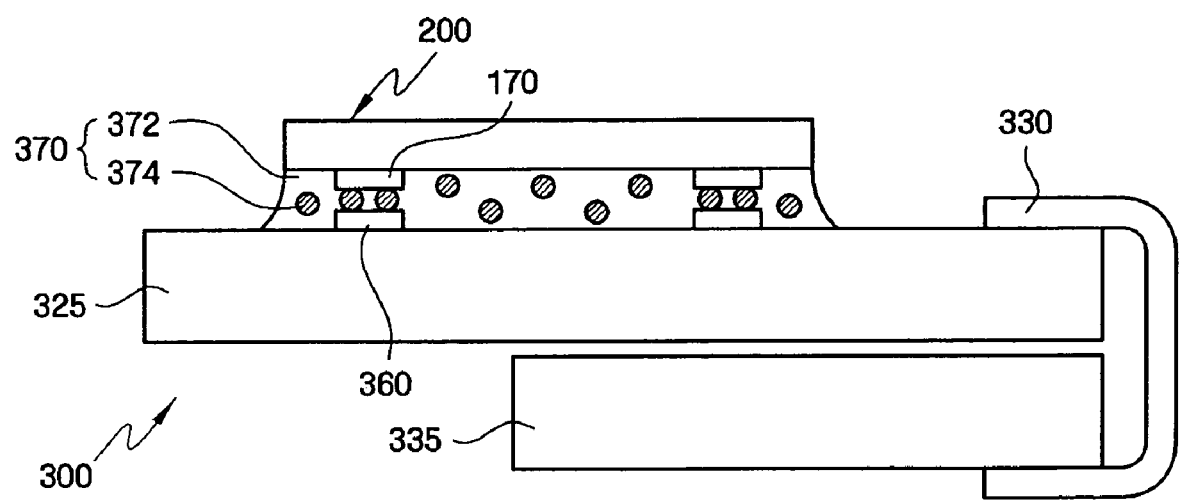
FIG. 13B is a cross-sectional view taken along a line B-B' of FIG. 13A.

FIG. 13A is a plan view of an LCD (liquid crystal display) panel assembly on which the LDI chip 200 according to one embodiment of the present invention is mounted by a COG method, and FIG. 13B is a cross-sectional view taken along a line B-B' of FIG. 13A.

Referring to FIGS. 13A and 13B, an LCD device 300 of the present invention includes the LDI chip 200 and an LCD panel assembly 325. The LDI chip 200 is directly mounted on the LCD panel assembly 325 comprised of a thin film transistor (TFT) panel 310 and a color filter panel 320. Further, a PCB 335 is connected to the LCD panel assembly 325 through a flexible substrate 330. The TFT panel 310 contains a matrix of TFTs. The color filter panel 320 contains a lattice-shaped black matrix, red/green/blue (RGB) pixels, and an indium tin oxide (ITO) electrode. A liquid crystal (not shown) is injected between the panels 310 and 320. Wiring such as data lines 340, gate lines 350, transmission lines 345 and 355 for a gate driving signal are formed on the TFT panel 310 adjacent to the effective display region.

Referring to FIG. 13B, the LDI chip 200 having the hybrid Au bump 170 according to the present invention is directly connected to the wirings 340, 350, 345, 355 on the TFT panel 310 or a pad 360 connected to the wirings 340, 350, 345, 355 by a face-down bonding method. At the same time, an anisotropic conductive film (ACF) 370 is used to connect the LDI chip 200. The ACF 370 is composed of small conductive particles 374 scattered in an adhesive film 372. The adhesive film 372 is about 15-35 μm and the diameter of the conductive particles 374 is about 3-15 μm. The adhesive film 372 can be formed of a thermoplastic film such as styrene-butadiene rubber, polyvinyl butylene, a thermosetting film such as epoxy resin, polyurethane, acrylic resin or a mixed film of the thermoplastic film and the thermosetting film can be used. The conductive particles 374 can be made of gold, silver, nickel, glass, or polymer coated with a metal. After the ACF 370 is adhered to the wirings 340, 350, 345, 355 of the LCD panel assembly 325 or the pad 360 is connected to the wirings 340, 350, 345, 355, and the hybrid Au bump 170 is adhered to the ACF 370 to correspond to the pad 360, they are thermally compressed. As a result, electrical connection between the hybrid Au bump 170 and the pad 360 is achieved by the conductive particles 374.

Although the COG mounting method using the ACF is shown in FIG. 13B, it is a matter of course that the COG mounting method using non-conductive paste (NCP) can be used. Although the COG mounting method using the NCP is not shown in the drawing, the hybrid Au bump 170 is directly connected to the pad 360 and the LDI chip 200 is adhered to the LCD panel assembly 325 by the NCP.

The COG mounting method has the following advantages. It is easy to repair; resin is not needed to fill a gap (void) between the LDI chip 200 and the LCD panel assembly 325; and since an additional package substrate is not needed, the mounting cost is reduced.

Figure 14:
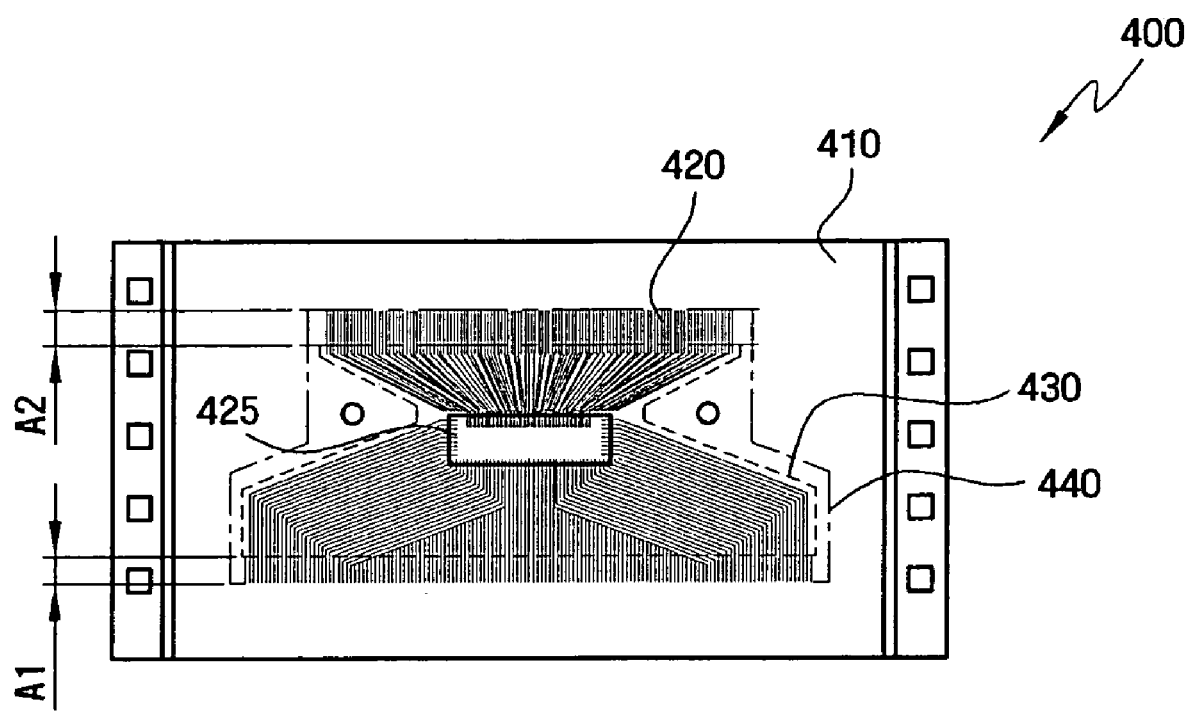
FIG. 14 is a plan view of a tape wiring board on which the LDI chip according to the various embodiments of the present invention is mounted.

FIG. 14 is a plan view of a tape wiring board 400 on which the LDI chip according to the various embodiments of the present invention described in FIGS. 1 through 12 is mounted. Referring to FIG. 14, wiring 420 are formed on a flexible film 410 formed of a bendable material such as polyimide. In a case of the tape wiring board 400 for a tape carrier package (TCP), a region where the LDI chip is adhered, that is, a window 425, is in the middle of the flexible film 410. A tape wiring board for a COF package differs from the tape wiring board from the TCP in that the wiring 420 is arranged on the flexible film 410 without the window 425. The wiring 420 is formed of copper (Cu) and a material plating tin, gold, nickel, or solder on a surface of Cu to a thickness of about 5-20 μm.

Reference numeral 430 denotes a region coated with solder resist. This region 430 prevents the wiring 420 from being oxidized when exposed to the outside, and from being opened by foreign materials. Reference numeral 440 denotes a user region which is cut from the flexible film 410.

Reference numerals A1 and A2 are external connection terminals which are directly adhered to a PCB or an LCD panel.

Figure 15:
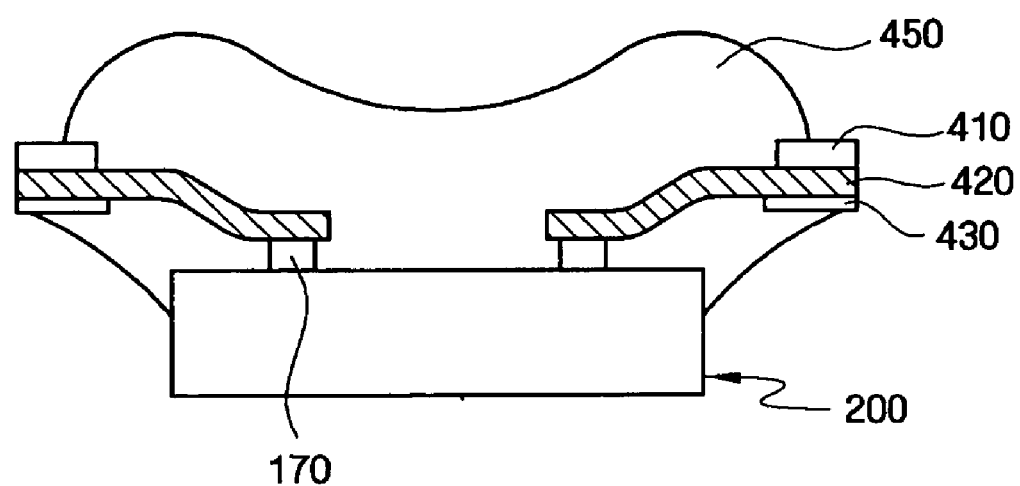
FIG. 15 is a cross-sectional view of a tape carrier package (TCP) on which the LDI chip according to one embodiment of the present invention is mounted.
Figure 16:
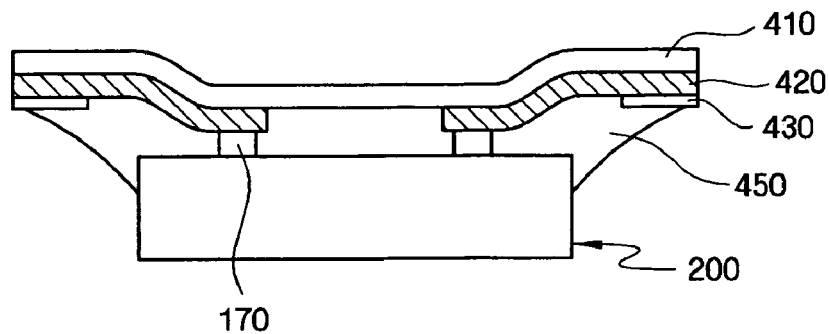
FIG. 16 is a cross-sectional view of a chip-on-film (COF) package on which the LDI chip according to one embodiment of the present invention is mounted.

FIGS. 15 and 16 are cross-sectional views of the TCP and the COF package on which the LDI chip 200 according to one embodiment of the present invention is mounted, respectively. Referring to FIGS. 15 and 16, the LDI chip 200 having the hybrid Au bump 170 according to the present invention is connected to internal connection terminals of the wiring 420 on the flexible film 410 by a face-up bonding method. Resin 450 is formed at both sides of the LDI chip 200 to cover a bonding structure comprised of the solder resist 430, the wiring 420, and the hybrid Au bump 170.

Figure 17:
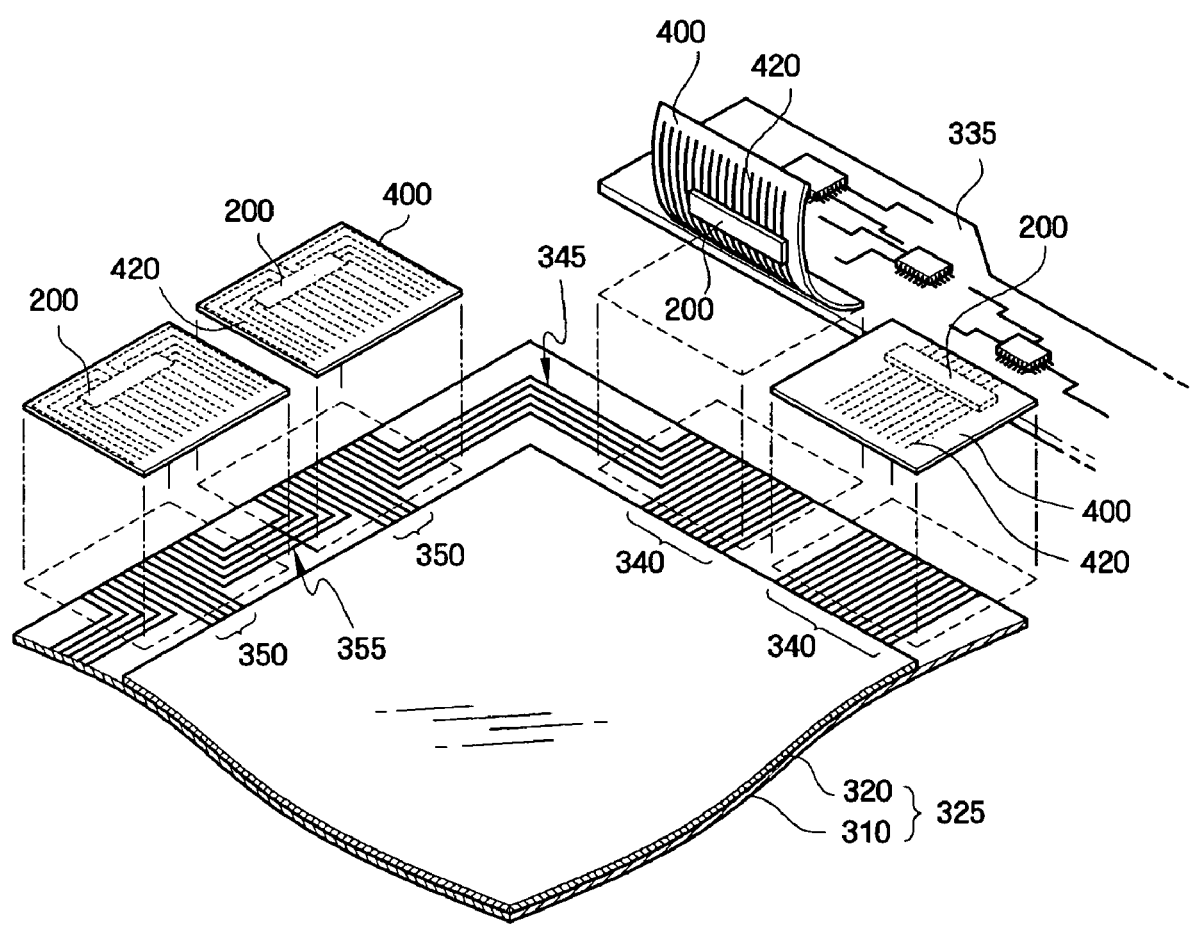
FIG. 17 is a schematic view of an LCD panel assembly in which the LDI chip according to the embodiments of the present invention is mounted in the form of a COF package.

FIG. 17 is a schematic view of an LCD panel assembly 325 in which the LDI chip according to the embodiments of the present invention is mounted in the form of a COF package. Descriptions about components identical or equivalent to those of the LCD panel assembly 325 shown in FIG. 13A are omitted. First sides of external connection terminals on the tape wiring board 400 are connected to data lines 340 or gate lines 350 on a TFT panel 310, respectively, and the other sides are connected to transmission lines 345 and 355 for a gate driving signal. Although the LCD panel assembly 325 in which the LDI chip is mounted in the form of the COF package is described in the present embodiment, the present invention is not limited thereto. It is a matter of course that the LCD panel assembly 325 in which the LDI chip is mounted in the form of a TCP can be applied.

In conclusion, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

As described above, according to a microelectronic device chip including a hybrid Au bump according to the present invention, foreign materials are not generated in a probe tip in a subsequent EDS test and the hybrid Au bump has a fine texture. Further, environmental pollution can be reduced compared with a case of using only a cyan Au plating layer.

What is claimed is:

1. A microelectronic device chip comprising:
a chip pad which is connected to a microelectronic device formed on a substrate to bring the microelectronic device into electrical contact with the outside of the chip; and
a hybrid Au bump which is formed on the chip pad and in which a cyan Au plating layer and a non-cyan Au plating layer are stacked.

2. The microelectronic device chip of claim 1, wherein the hybrid Au bump has a thickness in the range of 1-20 µm.

3. The microelectronic device chip of claim 2, wherein thicknesses of the cyan Au plating layer and the non-cyan Au plating layer are not less than 0.5 µm.

4. The microelectronic device chip of claim 3, wherein the cyan Au plating layer of the hybrid Au bump is located on the chip pad and the non-cyan Au plating layer of the hybrid Au bump is located on the cyan Au plating layer.

5. The microelectronic device chip of claim 3, wherein the non-cyan Au plating layer of the hybrid Au bump is located on the chip pad and the cyan Au plating layer of the hybrid Au bump is located on the non-cyan Au plating layer.

6. A microelectronic device chip comprising:
a chip pad which is connected to a microelectronic device formed on a substrate to bring the microelectronic device into electrical contact with the outside of the chip;
a passivation layer which protects the microelectronic device and exposes the chip pad;
a hybrid Au bump which is formed on the chip pad exposed by the passivation layer and in which a cyan Au plating layer and a non-cyan Au plating layer are stacked; and
a bump lower conductive layer which is formed between the chip pad and the bump to prevent mutual diffusion between the chip pad and the bump, and improve adhesion between the chip pad and the bump.

7. The microelectronic device chip of claim 6, wherein the hybrid Au bump has a thickness in the range of 1-20 µm.

8. The microelectronic device chip of claim 7, wherein thicknesses of the cyan Au plating layer and the non-cyan Au plating layer are not less than 0.5 µm.

9. The microelectronic device chip of claim 8, wherein the cyan Au plating layer of the hybrid Au bump is located on the chip pad and the non-cyan Au plating layer of the hybrid Au bump is located on the cyan Au plating layer.

10. The microelectronic device chip of claim 8, wherein the cyan Au plating layer of the hybrid Au bump is located on the chip pad and the cyan Au plating layer of the hybrid Au bump is located on the non-cyan Au plating layer.

11. The microelectronic device chip of claim 7, wherein the bump lower conductive layer is formed of at least one of TiW, Cr, Cu, Ti, Ni, NiV, Pd, Cr/Cu, TiW/Cu, TiW/Au and Ni V/Cu.

12. The microelectronic device chip of claim 11, wherein the bump lower conductive layer has a stacked structure comprising 0.005-0.5 µm thick TiW and 0.005-0.5 µm thick Au.

13. The microelectronic device chip of claim 6, wherein the hybrid Au bump has a structure in which one or more cyan Au plating layers and one or more non-cyan Au plating layers are stacked alternately.

14. A package comprising a microelectronic device chip according to any one of claims 1, 2-6 and 7-13 and a tape wiring board which includes wirings made up of external connection terminals and internal connection terminals electrically connected to a bump of the microelectronic device chip.

15. A liquid crystal display apparatus comprising a microelectronic device chip according to any one of claims 1, 2-6 and 7-13 and a liquid crystal display panel assembly in which wirings for connecting to the microelectronic device chip are formed; wherein a bump of the microelectronic device chip is electrically connected to the wirings.

16. The liquid crystal display apparatus of claim 15, wherein the microelectronic device chip is connected to the liquid crystal display panel assembly using one of a chip-on-glass (COG) method, a tape carrier package (TCP) method and a chip-on-film (COF) method.

* * * * *